United States Patent [19]

Kamman

[11] Patent Number: 4,681,780
[45] Date of Patent: Jul. 21, 1987

[54] CONTINUOUSLY CLEANED ROTARY COATING MASK

[75] Inventor: Daniel T. Kamman, Belmont, Mass.

[73] Assignee: Polaroid Corporation, Cambridge, Mass.

[21] Appl. No.: 556,962

[22] Filed: Dec. 1, 1983

[51] Int. Cl.[4] .................. B05D 5/00; B05D 1/32; C23C 14/04

[52] U.S. Cl. .................. 427/282; 118/50; 118/721; 427/255.5

[58] Field of Search .............. 427/282, 251, 255.5; 118/721, 504, 213, 301, 406, 50; 204/15; 156/654

[56] References Cited

U.S. PATENT DOCUMENTS

| | | | |
|---|---|---|---|
| 2,898,241 | 8/1959 | Charlton | 427/282 |
| 3,041,194 | 6/1962 | Rosen et al. | 427/282 |
| 3,088,859 | 5/1963 | Smith | 156/26 |
| 3,735,728 | 5/1973 | Krumme et al. | 118/721 |
| 3,854,442 | 12/1974 | Adam et al. | 118/721 |
| 3,866,565 | 2/1975 | Ridout | 118/721 |
| 4,478,878 | 10/1984 | Neuwald | 427/282 X |

Primary Examiner—Evan K. Lawrence
Attorney, Agent, or Firm—John J. Kelleher

[57] ABSTRACT

A method and apparatus for continually depositing coating materials on a moving web in precise shapes or patterns. Two enclosed chambers and a rotatably mounted mask having pattern-shaped openings formed therein are provided, with the mask openings being alternately movable between each of the enclosed chambers. In one enclosed chamber, coating materials are applied through the mask openings to web materials presented thereat. In the other chamber, cleaning apparatus continuously cleans rotary mask surfaces to thereby prevent pattern-definition-degrading coating material buildup on rotary mask surfaces immediately adjacent the mask openings. Apparatus is also provided for generating and maintaining a partial vacuum within each enclosed chamber.

10 Claims, 4 Drawing Figures

4,681,780

CONTINUOUSLY CLEANED ROTARY COATING MASK

BACKGROUND OF THE INVENTION

The present invention relates to a method and apparatus for depositing materials on a moving web in precise shapes or patterns, in general, and to such method and apparatus for preventing a deterioration in the pattern contours of materials being continually deposited on such a web for extended periods of time, in particular.

Applying coating materials to a moving web through a pattern forming mask for extended periods of time often produces unacceptable changes in the shape being formed by the mask pattern. This shape change is primarily due to an excessive buildup of coating materials on surfaces immediately adjacent and/or at the edges of the pattern-forming mask openings. Such excessive coating-material buildup eventually reduces mask opening size. If the mask openings are relatively large, reductions in mask opening size may have little or no meaningful effect on material shape. However, when mask opening size is extremely small, such as on the order of a few thousands of an inch, small changes in mask opening size can have a substantial negative effect on coating material shape. If the coating mask is periodically removed from the coating apparatus and thoroughly cleaned, changes in mask opening contours can be avoided. However, in addition to this being a time-consuming process, such a process greatly reduces the amount of time coating apparatus is available for coating purposes, and therefore, the volume of coated product that can be produced by such apparatus in a given period of time. Periodic cleaning of a coating mask employed in continuous coating apparatus would obviously produce the greatest reduction in coated-product output volume.

One very common material pattern that can be deposited on a moving web, through a coating mask, by presently available apparatus for extended periods of time before the coating mask needs cleaning is that of a continuous coating material stripe. Apparatus capable of depositing such a stripe or a plurality of such stripes on a moving web is shown in U.S. Pat. No. 3,866,565 to RIDOUT. The apparatus comprises a plurality of spaced-apart wheels or discs mounted for rotation on a common shaft, with coating material in the form of a continuous stripe being deposited on web material presented at the peripheries of said spaced-apart wheels. Coating apparatus of this type may be capable of placing relatively large width stripes on a moving web for extended periods of time before wheel or disc cleaning might be necessary. However, it would be difficult if not impossible to produce such coating apparatus that would be capable of simultaneously placing large numbers of stripes having stripe densities on the order of 40 stripes per inch on a moving web whether or not such cleaning would be necessary, primarily because of the extremely small disc thicknesses that would be required to produce such densities. Stripe densities on this order of magnitude are required in, for example, the manufacture of liquid crystal displays.

The primary object of the present invention is, therefore, to provide a method and apparatus for continuously cleaning a coating mask employed in web coating apparatus for the purpose of placing coating materials on a moving web surface having predetermined contours or shapes.

Another object of the present invention is to provide a method and apparatus for maintaining the definition or contours of a coating mask pattern for extended periods of time.

A further object of the present invention is to provide a method and apparatus for maintaining the definition of extremely small pattern openings in a web coating mask.

Other objects, features, and advantages of the present invention will be readily apparent from the following description of the preferred embodiment thereof taken in conjunction with the accompanying drawings.

SUMMARY OF THE INVENTION

In accordance with the teachings of the present invention, a method and apparatus are provided for continually depositing materials on a moving web in a welldefined pattern for extended periods of time. At least two enclosed chambers and a rotatably mounted mask form a portion of said apparatus, with pattern openings formed in said mask being alternately movable between said enclosed chambers. In one of said chambers, coating materials are applied through pattern mask openings to web materials presented thereat. In another of said chambers, cleaning means continuously clean said rotary mask to thereby prevent pattern-definition-degrading coating material buildup on the rotary mask surfaces immediately adjacent said pattern mask openings. Apparatus is also provided for generating and maintaining a partial vacuum within each of said enclosed chambers.

DESCRIPTION OF THE PREFERRED EMBODIMENTS

Figure 1:
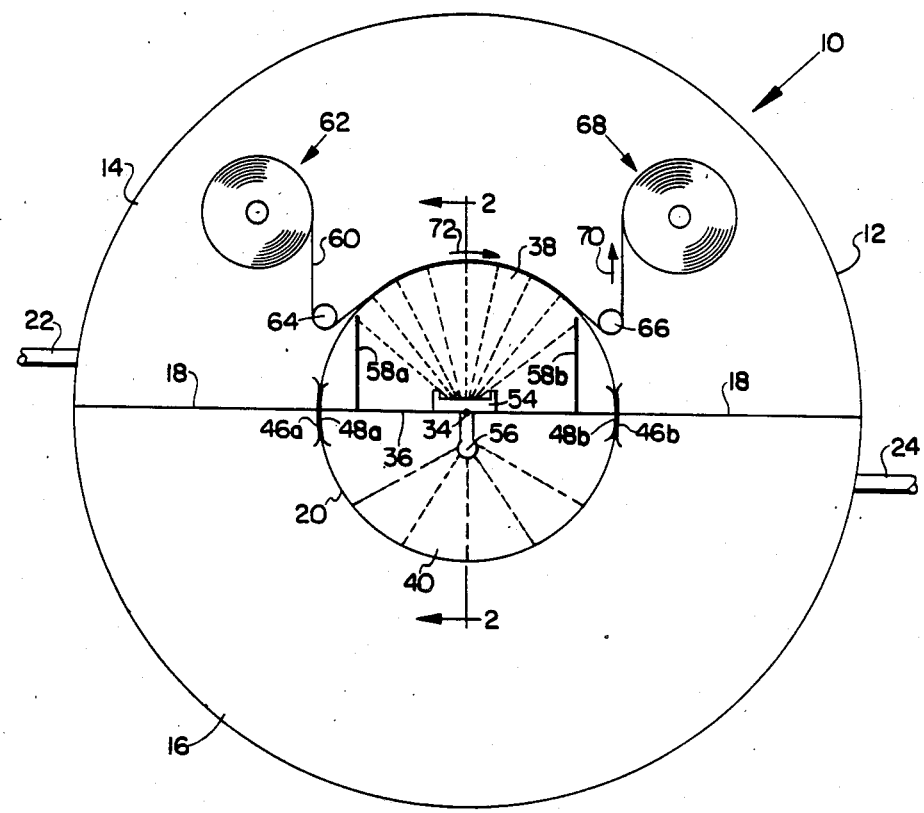
FIG. 1 is a schematic diagram, in elevation, of web coating apparatus employing the continuously cleaned pattern forming coating mask of the present invention.

In FIG. 1 of the drawings, web coating apparatus 10 incorporating a preferred embodiment of the present invention, is depicted. As shown in said drawing FIG. 1, web coating apparatus 10 includes housing 12 whose interior is divided into separate enclosed partially airtight chambers 14 and 16 adjacent each other with each chamber sharing common wall 18, a wall that forms a portion of the structure that isolates these chambers from one another. Chamber 14 is the chamber where web coating takes place, and chamber 16 is the chamber where the cleaning of rotary mask 20 is accomplished. When web coating apparatus 10 is operational, chambers 14 and 16 are maintained at negative or partial vacuum pressure levels with coating chamber 14 being preferably maintained at a higher negative pressure than coating mask cleaning chamber 16 for optimum vacuum deposition. Chamber 14 is partially evacuated through conduit 22 by vacuum generating means (not shown) connected thereto while coating mask cleaning chamber 16 is partially evacuated through conduit 24 by vacuum generating means (also not shown) that is connected to said conduit 24.

Figure 2:
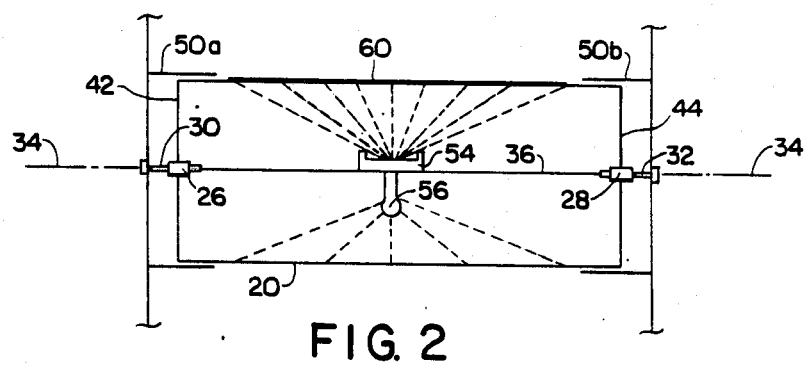
FIG. 2 is a sectional view taken on the line 2—2 in drawing FIG. 1.

With reference to both FIGS. 1 and 2 of the drawings, hollow cylindrical coating mask 20, closed at each end, is rotatably mounted on housing 12 through bearings 26 and 28 and hollow support shafts 30 and 32, respectively. Axis of rotation 34 of cylindrical coating mask 20 lies within the plane of common chamber wall 18 such that the upper half of coating mask 20 projects into coating chamber 14 while the other or lower half of said coating mask 20 projects into cleaning chamber 16. Flat plate 36 is mounted in a fixed horizontal position within rotary mask 20 by means of hollow support shafts 30 and 32, said shafts being attached in a fixed position to housing 12 and to opposite ends of said plate 36. With plate 36 so positioned, the internal volume of rotary coating mask 20 is horizontally divided into two fairly equal spaces consisting of upper or coating space 38 and lower or cleaning space 40.

A sliding contact seal (not shown) is provided between the fixedly attached ends of plate 36 and circular end plates 42 and 44 of hollow cylindrical mask 20 in order to form a seal between said plate 36 and said end plates 42 and 44 at these two interfaces. In addition, the inside edges of common wall 18 and the outside edges of horizontal plate 36 (FIG. 1) includes close fitting shrouds 46a, 46b and 48a, 48b, respectively, that provide a relatively low pressure leak path between coating chamber 14 and cleaning chamber 16 during the web coating/mask cleaning process. Also, cylindrical compression seals 50a and 50b at the opposite ends of rotary mask 20 provide a sliding contact pressure seal between the ends of said mask 20 and the immediately adjacent inside walls of coating apparatus housing 12. It is the combination of common wall 18, plate 36, the sliding contact seals between the ends of plate 36 and the circular end plates of rotary mask 20 together with shrouds 46a, 46b, 48a, 48b and cylindrical compression seals 50a and 50b that provide a finite degree of pressure isolation between coating chamber 14 and mask cleaning chamber 16. This combination of sealing devices between the coating and cleaning sections of apparatus 10 also prevents removed coating materials and other such potential contaminants within cleaning chamber 16 from reaching and thereby contaminating the material being coated within coating chamber 14.

Figure 3:
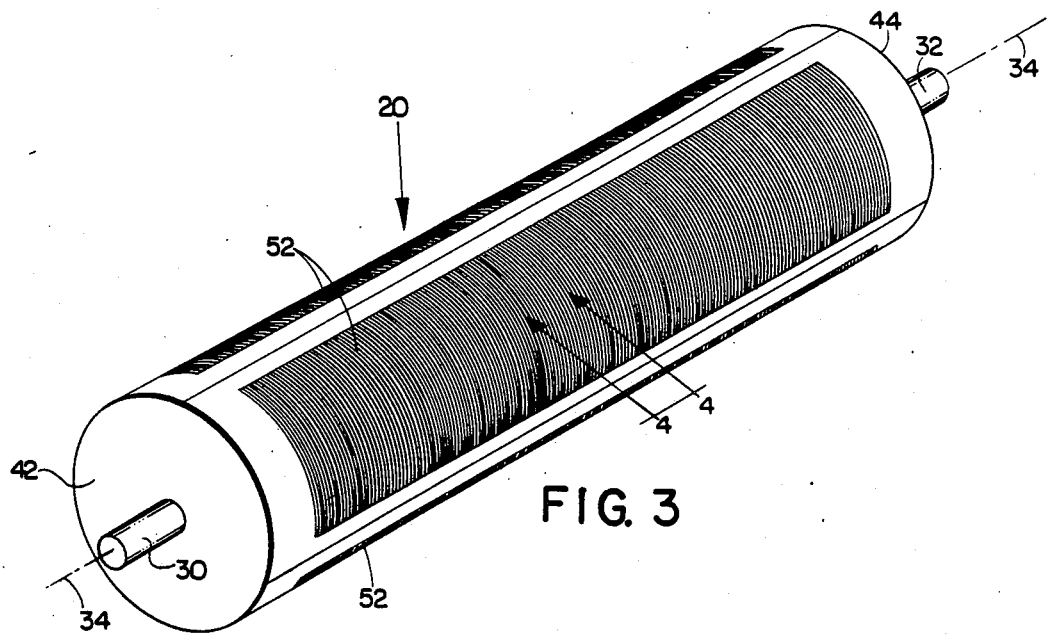
FIG. 3 is an enlarged perspective view of the continuously cleaned coating mask that is schematically depicted in drawing FIGS. 1 and 2.
Figure 4:
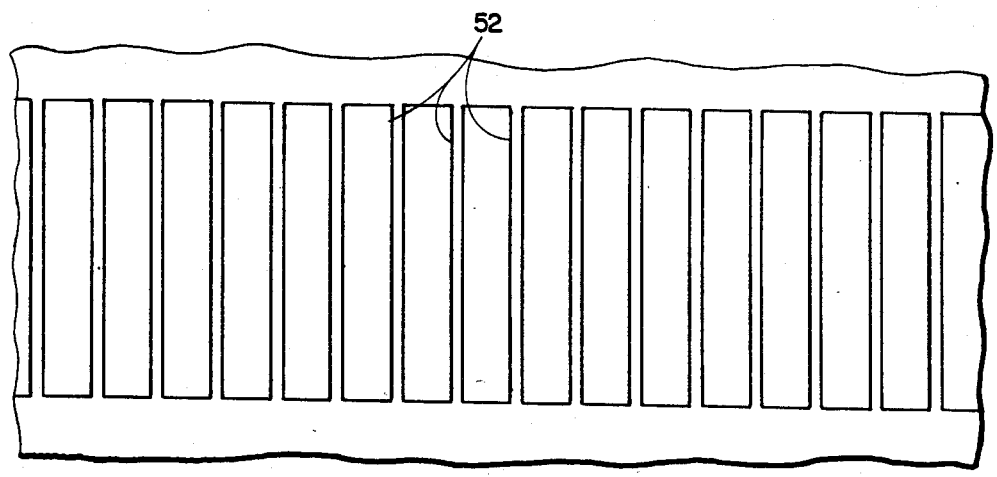
FIG. 4 is an enlarged fragmentary view taken on the line 4—4 in drawing FIG. 3.

Cylindrical rotary coating mask 20 is rotatable about rotational axis 34 such that any one point on the cylindrical surface of said mask 20 is ultimately moved between chambers 14 and 16 as mask 20 is rotated. An enlarged perspective view of rotary mask 20 is shown in drawing FIG. 3. As previously explained, coating mask 20 is in the form of a hollow cylinder, closed at each end, that is rotatable about hollow support shaft axis 34. Rotary mask 20 is modular in construction and consists of four pattern-forming curved members of equal size and shape that are removably assembled into the shape of a cylinder, of circular cross-section, with circular endplates being removably attached, by suitable fasteners (not shown) in a conventional manner, to opposite ends of said pattern-forming members. The pattern formed in said pattern-forming members is that of a multiplicity of rectangular slots or openings that are parallel to and spaced from one another. An enlarged fragmentary view of a portion of said rectangular slot pattern in one of said pattern-forming curved modular members taken on line 4—4 in FIG. 3 is shown in drawing FIG. 4. These particular pattern-forming rectangular openings are 12 inches in length, are 0.020 inch wide and are spaced 0.005 inch from adjacent openings. There are four sets of these pattern-forming openings, one on each of the four curved modular sections of pattern-forming mask 20. Any number of different pattern shapes may be formed in the cylindrical surface of coating mask 20 for other coating tasks, including those requiring the maintenance of the dimensions of relatively small pattern openings for extended periods of time.

Referring again to FIGS. 1 and 2, as previously described, plate 36 is mounted in a fixed horizontal position with respect to shafts 30, 32 and housing 12, to which said shafts are attached, within the cylindrical space formed by rotary mask 20. Crucible 54 for holding material to be vapor deposited is supported on the upper surface of stationary or fixedly mounted plate 36. In addition, mask cleaning means 56 is supported on the lower surface of pate 36. Cleaning means 56 is preferably in the form of ion-beam etching apparatus, but may take on any number of different forms such as reactive etching, ablation by heating, evaporation, plasma etching, etc. Baffles 58a and 58b are provided to prevent coating materials evaporated from crucible 54 from passing through certain openings in coating mask 20 while they are spaced from the material to be coated. If coating materials were permitted to pass through these coating mask 20 openings while the material to be coated was spaced from same, the pattern of deposited coating material would become greatly distorted.

OPERATION

In operation, and with continued reference to FIGS. 1 and 2 of the drawings, web 60, which is the material to be coated by coating apparatus 10, is placed on unwind station 62 with its free end threaded under idler rollers 64 and 66, in contact with rotary mask 20, and then into the take-up reel in rewind station 68. Coating chamber 14 is partially evacuated through conduit 22 and cleaning chamber 16 is partially evacuated through conduit 24 but to a greater degree. Coating material for vapor deposition on web 60 and rotary mask 20 cleaning energy is supplied to crucible 54 and cleaning means 56, respectively, through the center of hollow support shafts 30 and 32 from a source of coating material and cleaning energy, neither of which are shown. Drive means (not shown) coupled to unwind station 62 and rewind station 68 move web 60 in direction 70 and rotary mask 20, which is in direct physical contact with web 60, in direction 72 about axis of rotation 34 during the web coating process. As web 60 is moved into contact with mask 20 for movement therewith, evaporated coating materials from crucible 54 is deposited on a portion of the mask contacting surface of web 60 through pattern-forming openings in mask 20 with the shape of said openings and therefore the shape of the deposited materials being a series of spaced-apart groups of parallel stripes for subsequent use in, for example, liquid crystal displays. Each of the stripes within each of said groups is 12 inches long in the direction of web travel, is 0.020 inch wide and is spaced 0.005 inch from adjacent stripes as previously noted and therefore have a stripe density of 40 lines per inch at right angles to the direction of web travel. Those inside surface portions of mask 20 immediately adjacent the mask openings as well as other internal mask surfaces become coated with the coating material from crucible 54 that does not pass through the mask 20 openings during the coating process. However, as mask 20 continues to rotate about rotational axis 34, it moves down into cleaning chamber 16 through low leak or pressure sealing shrouds 46b and 48b where these surfaces are continuously cleaned by cleaning means 56 whose preferred characteristics were described above. In the preferred embodiment where mask cleaning means 56 is in the form of ion-beam etching apparatus, the etch rate per unit area during the cleaning process is adjusted to equal or exceed the coating deposition rate.

After being cleaned within cleaning chamber 16 by cleaning means 56, coating free mask 20 then rotates back up into coating chamber 14 through low leak or pressure sealing shrouds 46a and 48a where it can again provide a mask whose pattern shaped openings are free from any coating materials that might potentially degrade material-pattern definition. Cleaning means 56 and rotary mask 20 are preferably oriented such that materials not vaporized by the cleaning process are moved by gravitational forces to the bottom of cleaning chamber 16 where they would be unlikely to contaminate the web coating process. This alternate coating and cleaning of rotary mask 20 as it rotates between coating chamber 14 and cleaning chamber 16 is continuously repeated throughout the web coating process to thereby prevent degradation of material-pattern definition.

It will be apparent to those skilled in the art from the foregoing description of my invention that various improvements and modifications can be made in it without departing from its true scope. The embodiments described herein are merely illustrative and should not be viewed as the only embodiments that might encompass my invention.

What is claimed is:

1. Apparatus for continually depositing coating materials on a moving web in a precise well-defined pattern, comprising:
    means for defining at least two separate enclosed chambers, with each of said chambers being capable of supporting a partial vacuum therein and with said chambers being generally isolated from each other;
    a pattern defining, movably mounted mask having pattern-forming openings therein, said mask being alternately movable between internal portions of said chambers;
    means for moving a surface of said web into pattern opening covering intimate contact with said movably mounted mask for movement therewith and for moving said mask between said internal chamber portions;
    means within one of said chambers for applying coating materials to the said pattern defining openings formed in said movably mounted mask and to a web surface presented thereat; and
    means within another of said chambers for cleaning coating materials from the pattern defining mask surfaces adjacent said pattern mask openings.

2. The apparatus of claim 1 further comprising means for producing a partial vacuum within each of said enclosed chambers.

3. The apparatus of claim 2, wherein the level of vacuum within one of said enclosed chambers is different from the level of vacuum within the other of said enclosed chambers.

4. Apparatus for depositing coating materials in a precise pattern on a given surface of a workpiece, said apparatus comprising:
    at least a pair of chambers with each of said chambers being capable of supporting a partial vacuum therein and with said chambers being generally isolated from each other;
    a mask arrangement defining at least one mask pattern mounted for movement between said chambers;
    means for advancing said mask arrangement to move said mask pattern alternately between each said chamber;
    means for advancing said workpiece in one of said chambers to bring its said given surface into alignment with said mask pattern when it is within said one chamber;
    means operative within said one chamber to apply coating material to said surface of said workpiece through said mask pattern; and
    means operative within the other of said chambers for cleaning said mask pattern when it is advanced into said other chamber whereby following each deposition of coating with said one chamber, said mask pattern is automatically advanced to and cleaned within said other chamber and then returned to said one chamber for a further deposit of coating on a workpiece.

5. The apparatus of claim 4 wherein said mask arrangement comprises a closed loop having one or more patterns therealong, said loop being extended between said chambers, and said mask advancing means includes means for advancing said closed loop in a given direction so as to thereby advance said mask patterns into and through each of said chambers in succession.

6. The apparatus of claim 5 wherein said workpiece is an elongated web, and said means for advancing said workpiece includes means for advancing said web within said chamber along a path which contacts said closed loop and in the same direction and speed of the advancement of said loop whereby said web and said loop are advanced together for a given time within said one chamber.

7. The apparatus of claim 6 wherein said mask arrangement is cylindrical.

8. The apparatus of claim 5 wherein said chambers are joined along essentially a common wall configuration having a pair of spaced openings through which said loop extends between each chamber.

9. A method for continually depositing coating materials on a moving web, comprising the steps of:
    providing at least two separate enclosed chambers with each of said chambers being capable of supporting a partial vacuum and with said chambers being generally isolated from one another;
    providing a pattern defining movably mounted mask having pattern-forming openings therein with portions of said mask being alternately movable between said enclosed chambers;
    moving a surface of said web into pattern opening covering intimate contact with said movably mounted mask for movement therewith while simultaneously moving said mask portions between said internal chamber portions;
    providing means within one of said enclosed chambers for applying coating materials to the said pattern defining openings formed in said movably mounted mask and to a web surface presented thereat; and
    providing means within another of said chambers for cleaning coating materials from the pattern defining mask surfaces adjacent said pattern mask openings.

10. The method of claim 9 further comprising the step of providing means for producing a partial vacuum within each of said enclosed chambers.

* * * * *